(12) United States Patent
McMahon

(10) Patent No.: US 10,289,761 B1
(45) Date of Patent: May 14, 2019

(54) METHOD FOR MODELING DYNAMIC TRAJECTORIES OF GUIDED, SELF-PROPELLED MOVING BODIES

(71) Applicant: Matthew D. McMahon, Damascus, MD (US)

(72) Inventor: Matthew D. McMahon, Damascus, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 1074 days.

(21) Appl. No.: 14/109,136

(22) Filed: Dec. 17, 2013

Related U.S. Application Data

(60) Provisional application No. 61/834,260, filed on Jun. 12, 2013.

(51) Int. Cl.
*G06F 17/10* (2006.01)
*G06F 17/50* (2006.01)

(52) U.S. Cl.
CPC .............................. *G06F 17/5009* (2013.01)

(58) Field of Classification Search
CPC ..... G06G 7/80; F41G 3/00; F41G 3/26; F42B 12/36; A63B 43/00; A63B 69/00; A63B 69/36
USPC ............................................................ 703/2
See application file for complete search history.

(56) References Cited

U.S. PATENT DOCUMENTS

| | | | |
|---|---|---|---|
| 4,568,823 A * | 2/1986 | Diehl | F41G 3/12 235/404 |
| 5,768,122 A * | 6/1998 | Motoc | B25J 9/1664 700/18 |
| 6,186,002 B1 * | 2/2001 | Lieberman | A63B 24/0021 73/432.1 |
| 7,500,423 B2 * | 3/2009 | Strand | F41G 3/142 235/404 |
| 2005/0101415 A1 * | 5/2005 | Sweeney | A63B 24/0021 473/407 |

(Continued)

OTHER PUBLICATIONS

Wikipedia, Derivative, 2016, pp. 1-20, https://en.wikipedia.org/wiki/Derivative.*

(Continued)

*Primary Examiner* — Rehana Perveen
*Assistant Examiner* — Cuong V Luu
(74) *Attorney, Agent, or Firm* — Howard Kaiser

(57) ABSTRACT

According to exemplary practice of the present invention, the dynamic trajectory of a moving body is incrementally modeled using temporal and spatial relationships between the body and the target that the body pursues. In each time step, the body has starting positional coordinates and ending positional coordinates. The horizontal travel distance is calculated by taking into account the body's speed and the body's horizontal distance from the target. The vertical travel distance is calculated by taking into account the body trajectory's spatial derivative and the body's horizontal travel distance. The body's time-step-ending positional coordinates thus reflect the change, in accordance with the horizontal travel distance and the vertical travel distance, relative to the body's time-step-starting positional coordinates. Each succeeding time step repeats the computations whereby the starting positional coordinates are the ending positional coordinates of the preceding time step.

19 Claims, 9 Drawing Sheets

(56) References Cited

U.S. PATENT DOCUMENTS

| | | | | |
|---|---|---|---|---|
| 2006/0185506 | A1* | 8/2006 | Strand | F41G 3/142 89/41.03 |
| 2008/0206718 | A1* | 8/2008 | Jaklitsch | F41A 31/00 434/12 |
| 2008/0312010 | A1* | 12/2008 | Marty | A63B 24/0003 473/447 |
| 2010/0026554 | A1* | 2/2010 | Longman | F41G 5/08 342/62 |
| 2010/0264216 | A1* | 10/2010 | Kenefic | F42B 15/01 235/400 |
| 2011/0277448 | A1 | 11/2011 | Roberts | |
| 2012/0316824 | A1* | 12/2012 | Africa, Jr. | F41H 11/02 702/144 |
| 2013/0009014 | A1* | 1/2013 | Bordetsky | B64D 17/00 244/189 |
| 2013/0013135 | A1* | 1/2013 | Yakimenko | B64D 17/00 701/18 |
| 2013/0130204 | A1* | 5/2013 | Lim | F41A 33/02 434/22 |
| 2013/0274040 | A1* | 10/2013 | Coza | G09B 19/0038 473/570 |
| 2014/0249691 | A1* | 9/2014 | Hafner | B62D 13/06 701/1 |
| 2014/0305025 | A1* | 10/2014 | Tubb | F41G 1/473 42/130 |
| 2014/0335478 | A1* | 11/2014 | Northrup | F41G 3/2633 434/22 |
| 2015/0128823 | A1* | 5/2015 | Akcasu | F42B 10/56 102/517 |
| 2015/0284010 | A1* | 10/2015 | Beardsley | B60W 50/10 701/41 |
| 2015/0294044 | A1* | 10/2015 | Schaer | B21D 43/05 700/112 |
| 2017/0205197 | A1* | 7/2017 | Sammut | F41G 3/08 |
| 2018/0129214 | A1 | 5/2018 | During et al. | |
| 2018/0149480 | A1 | 5/2018 | Wang et al. | |
| 2018/0150056 | A1 | 5/2018 | Bonay et al. | |

OTHER PUBLICATIONS

Zhe Gu Video Database Retrieval Based on Trajectory Analysis University of British Columbia, Oct. 1999, pp. 1-75.*

Chang et al. A Fully Automated Content-Based Video Search Engine Supporting Sptiotemporal Queries IEEE Transactions on Circuits and Systems for Video Technology, vol. 8, No. 5, Sep. 1998, pp. 602-614.*

Chen et al. Motion Trajectory Matching of Video Objects Proceedings of SPIE, 2000, pp. 544-553.*

Patricia A. Hawley and Ross A. Blauwkamp, "Six-Degree-of-Freedom Digital Simulations for Missile Guidance, Navigation, and Control," Johns Hopkins Applied Physics Laboratory (APL) Technical Digest, vol. 29, No. 1, pp. 71-84, 2010.

James J. Little and Zhe Gu, "Video Retrieval by Spatial and Temporal Structure of Trajectories," Proceedings of the SPIE, vol. 4315, pp. 545-552, Storage and Retrieval for Media Databases, International Society for Optics and Photonics, 2001.

* cited by examiner

RANGE TO CURRENT TARGET [km]

| | 0 | 0.2 | 0.4 | 0.6 | 0.8 | 1 |
|---|---|---|---|---|---|---|
| -1 | 1 | 1.02 | 1.04 | 1.06 | 1.08 | 1.1 |
| -0.95 | 1.1 | 1.12 | 1.14 | 1.16 | 1.18 | 1.2 |
| -0.9 | 1.2 | 1.22 | 1.24 | 1.26 | 1.28 | 1.3 |
| -0.85 | 1.3 | 1.32 | 1.34 | 1.36 | 1.38 | 1.4 |
| -0.8 | 1.4 | 1.42 | 1.44 | 1.46 | 1.48 | 1.5 |
| -0.75 | 1.5 | 1.52 | 1.54 | 1.56 | 1.58 | 1.6 |
| -0.7 | 1.6 | 1.62 | 1.64 | 1.66 | 1.68 | 1.7 |
| -0.65 | 1.7 | 1.72 | 1.74 | 1.76 | 1.78 | 1.8 |
| -0.6 | 1.8 | 1.82 | 1.84 | 1.86 | 1.88 | 1.9 |
| -0.55 | 1.9 | 1.92 | 1.94 | 1.96 | 1.98 | 2 |
| -0.5 | 2 | 2.02 | 2.04 | 2.06 | 2.08 | 2.1 |
| -0.45 | 2.1 | 2.12 | 2.14 | 2.16 | 2.18 | 2.2 |
| -0.4 | 2.2 | 2.22 | 2.24 | 2.26 | 2.28 | 2.3 |
| -0.35 | 2.3 | 2.32 | 2.34 | 2.36 | 2.38 | 2.4 |
| -0.3 | 2.4 | 2.42 | 2.44 | 2.46 | 2.48 | 2.5 |
| -0.25 | 2.5 | 2.52 | 2.54 | 2.56 | 2.58 | 2.6 |
| -0.2 | 2.6 | 2.62 | 2.64 | 2.66 | 2.68 | 2.7 |
| -0.15 | 2.7 | 2.72 | 2.74 | 2.76 | 2.78 | 2.8 |
| -0.1 | 2.8 | 2.82 | 2.84 | 2.86 | 2.88 | 2.9 |
| -0.05 | 2.9 | 2.92 | 2.94 | 2.96 | 2.98 | 3 |
| 0 | 3 | 3.02 | 3.04 | 3.06 | 3.08 | 3.1 |

ALTITUDE TO CURRENT TARGET [km]

VALUES: DOWNRANGE SPEED COMPONENT [km/s]

FIG. 5

This figure is a large data table titled "RANGE TO CURRENT TARGET [km]" (column header) and "ALTITUDE TO CURRENT TARGET [km]" (row header), showing values of the wire shape derivative $da/dx$, rounded to 4 decimal places [unitless]. The table is visually split into two halves separated by a break, with range values from 0 to 1.2 km on the left and 8.8 to 10 km on the right.

VALUES: WIRE SHAPE DERIVATIVE $da/dx$, ROUNDED TO 4 DECIMAL PLACES [unitless]

FIG. 6      RANGE TO CURRENT TARGET [km]

| ALTITUDE TO CURRENT TARGET [km] | 0 | 0.2 | 0.4 | 0.6 | 0.8 | 1 |
|---|---|---|---|---|---|---|
| -1 | 1.9720 | 1.9958 | 2.0485 | 2.0852 | 2.0617 | 1.9637 |
| -0.95 | 1.8720 | 1.8958 | 1.9485 | 1.9852 | 1.9617 | 1.8637 |
| -0.9 | 1.7720 | 1.7958 | 1.8485 | 1.8852 | 1.8617 | 1.7637 |
| -0.85 | 1.6720 | 1.6958 | 1.7485 | 1.7852 | 1.7617 | 1.6637 |
| -0.8 | 1.5720 | 1.5958 | 1.6485 | 1.6852 | 1.6617 | 1.5637 |
| -0.75 | 1.4720 | 1.4958 | 1.5485 | 1.5852 | 1.5617 | 1.4637 |
| -0.7 | 1.3720 | 1.3958 | 1.4485 | 1.4852 | 1.4617 | 1.3637 |
| -0.65 | 1.2720 | 1.2958 | 1.3485 | 1.3852 | 1.3617 | 1.2637 |
| -0.6 | 1.1720 | 1.1958 | 1.2485 | 1.2852 | 1.2617 | 1.1637 |
| -0.55 | 1.0720 | 1.0958 | 1.1485 | 1.1852 | 1.1617 | 1.0637 |
| -0.5 | 0.9720 | 0.9958 | 1.0485 | 1.0852 | 1.0617 | 0.9637 |
| -0.45 | 0.8720 | 0.8958 | 0.9485 | 0.9852 | 0.9617 | 0.8637 |
| -0.4 | 0.7720 | 0.7958 | 0.8485 | 0.8852 | 0.8617 | 0.7637 |
| -0.35 | 0.6720 | 0.6958 | 0.7485 | 0.7852 | 0.7617 | 0.6637 |
| -0.3 | 0.5720 | 0.5958 | 0.6485 | 0.6852 | 0.6617 | 0.5637 |
| -0.25 | 0.4720 | 0.4958 | 0.5485 | 0.5852 | 0.5617 | 0.4637 |
| -0.2 | 0.3720 | 0.3958 | 0.4485 | 0.4852 | 0.4617 | 0.3637 |
| -0.15 | 0.2720 | 0.2958 | 0.3485 | 0.3852 | 0.3617 | 0.2637 |
| -0.1 | 0.1720 | 0.1958 | 0.2485 | 0.2852 | 0.2617 | 0.1637 |
| -0.05 | 0.0720 | 0.0958 | 0.1485 | 0.1852 | 0.1617 | 0.0637 |
| 0 | -0.0280 | -0.0042 | 0.0485 | 0.0852 | 0.0617 | -0.0363 |

VALUES: WIRE SHAPE DERIVATIVE *da/dx*,
ROUNDED TO FOUR DECIMAL PLACES [unitless]

METHOD FOR MODELING DYNAMIC TRAJECTORIES OF GUIDED, SELF-PROPELLED MOVING BODIES

CROSS-REFERENCE TO RELATED APPLICATIONS

This application claims the benefit of U.S. provisional application Ser. No. 61/834,260, incorporated herein by reference, filing date 12 Jun. 2013, title "Method for Modeling Dynamic Trajectories of Homing Missiles," inventor Matthew D. McMahon.

BACKGROUND OF THE INVENTION

The present invention relates to computer modeling and simulation of moving bodies, more particularly to computer modeling and simulation representative of dynamic trajectories of guided, self-propelled devices such as homing missiles and some air vehicles.

Currently, the highest-fidelity simulations of the trajectories of moving bodies are produced by so-called "six-degrees-of-freedom" ("6DOF") models. These conventional modeling methods take into account as much physics and engineering data as possible about the forces acting on the body, and produce detailed, accurate trajectories. In particular, 6DOF models are dynamic in the sense that they can show with great detail how a body whose motion is designed to maneuver toward an aimpoint can alter its trajectory if the aimpoint changes (or how plural bodies whose respective motions are designed to maneuver toward respective aimpoints can alter their respective trajectories if the respective aimpoints change).

However, 6DOF methods require intensive computational effort, and therefore usually consume a lot of time. For simulations with many simultaneously moving bodies, 6DOF models may take too long to compute trajectories (typically minutes for a single body), thus violating an application's overall simulation run-time requirements (which may require, for instance, hundreds of trajectories to be computed in less than a minute).

Greatly simplified trajectory models have been disclosed in the literature that may be produced using a paradigm in which the body trajectory (as determined by a high-fidelity 6DOF simulation) is separated into (ii) the overall trajectory shape, and (ii) the speed along the shape as a function of time. The present inventor has coined the term "bead-on-a-wire" in referring to this paradigm in general. Using the present inventor's terminology, according to the "bead-on-a-wire" paradigm, the body trajectory is separated into (i) the "wire" (overall trajectory shape), and (ii) the speed along the "wire" as a function of time.

Bead-on-a-wire models have the potential to be computed orders of magnitude faster than 6DOF models. However, these simplified models, as they are currently known, are not truly dynamic; that is, they cannot show how the trajectory changes dynamically with a moving aimpoint except in the simplest cases, where the body always moves along the straight line connecting the body to the current aimpoint.

Of interest herein, incorporated herein by reference, is Patricia A. Hawley and Ross A. Blauwkamp, "Six-Degree-of-Freedom Digital Simulations for Missile Guidance, Navigation, and Control," Johns Hopkins Applied Physics Laboratory (APL) Technical Digest, Laurel, Md., Volume 29, Number 1, pages 71-84, 2010.

Also of interest herein, incorporated herein by reference, is James J. Little and Zhe Gu, "Video Retrieval by Spatial and Temporal Structure of Trajectories," Proceedings of the SPIE, Volume 4315, pages 545-552, Storage and Retrieval for Media Databases, International Society for Optics and Photonics, 2001.

SUMMARY OF THE INVENTION

In view of the foregoing, an object of the present invention is to provide a better computer modeling methodology for representing dynamic trajectories (e.g., paths or courses) of moving bodies that are guided and self-propelled, such as homing devices and a variety of air vehicles.

The present invention represents a new and significant improvement in the computational efficiency of the simulation of the dynamic movement of a body that maneuvers toward a moving target but does not simply or necessarily move in a straight line towards that target at any given instant. The present invention's novel algorithmic method uniquely succeeds in describing intricate motion such as involving complex homing maneuvers, doing so in a computationally efficient manner.

Exemplary inventive practice implements a computer for describing motion of a moving object. An initial position of an object is established. The horizontal distance traveled by the object from the initial position is determined, this determination including taking into consideration the speed of the object, the horizontal distance between the object and a target, and the vertical distance between the object and the target. The vertical distance traveled by the object from the initial position is determined, this determination including taking into consideration the horizontal distance traveled and the spatial derivative of the trajectory of the object. The final position of the object is determined, based on the horizontal and vertical distances traveled by the object.

According to exemplary inventive practice, the horizontal distance traveled is the horizontal distance traveled by the object during the time step, and the vertical distance traveled is the vertical distance traveled by the object during the time step. The initial position is at the beginning of the time step. The final position is at the end of the time step. At least one iteration is performed of the acts of establishing the initial position, determining the horizontal distance traveled, determining the vertical distance traveled, and determining the final position. With respect to each iteration, the initial position is the final position of the previous iteration, and the beginning of the time step is the end of the time step of the previous iteration. According to many inventive embodiments, every time step has the same duration.

The present inventor has dubbed his invention the "maneuver field method." An inventive algorithm may be coded in practically any computer programming language. The present invention can be practiced to model motion of practically any type of moving body, and can be embodied, for instance, as a computer-implemented method, a system or apparatus including a computer, or a computer program product. Usual inventive practice implements a computer and a computer display to facilitate modeling of a body's motion, the computer including a processor and memory/storage, both volatile and non-volatile.

The "bead-on-a-wire" method that has been disclosed in the literature, such as by the aforementioned Little et al., works basically as follows. First, the wire shape is specified by a shape equation, where one spatial dimension is a function of other spatial dimensions and the parameters of the desired trajectory shape. Second, the speed profile is given by some equation, usually as a function of time.

According to the present invention's "bead-on-a-wire"-type method, the wire shape and speed are specified quite differently, as compared with the "bead-on-a-wire"-type method that is heretofore known. In exemplary inventive practice, the wire shape is defined through one or two interpolation tables of spatial derivatives. The present invention unique implements "bead-on-a-wire" trajectory principles for applications in which a guided, self-propelled moving body, such as a homing missile or an air vehicle, has a target that is continuously variable. According to exemplary inventive practice, an algorithm is given for interpreting two data fields, viz.: (i) the speed of the vehicle along some direction; and, (ii) the spatial derivative of the wire shape along some direction.

The inventive methodology captures much of the detail and adaptability found in the 6DOF simulations, while maintaining the computational efficiency of a bead-on-a-wire approach. The present invention is founded generally on bead-on-a-wire principles. Among the novel features of the present invention is the inventive use of the spatial gradient of the wire shape, in a bead-on-a-wire type construct, to dynamically determine the wire shape with a moving aimpoint.

The term "interpolation table" is broadly used herein to refer to any orderly arrangement of data that describes an interpolative relationship. In other words, an "interpolation table" is any organized dataset that lends itself to interpolation of data. An interpolation table can be embodied, for instance, in matrical or tabular form—e.g., as a "table" in a stricter sense of the word, having rows and columns of data in a rectangular format. Additionally or alternatively, an interpolation table can be embodied in graphical form—e.g., as a plot of data points. Generally speaking, it is common for computer code to describe a collection of data in terms of a numerical matrix.

According to exemplary practice of the present invention, the interpolation tables for wire shape gradient and body speed may have an arbitrary number of dimensions; that is, the interpolation tables may depend upon an arbitrary number of parameters, besides the distance to the current aimpoint. Inventive practice permits use of interpolation tables with any interpolation method; nevertheless, it may be preferable to practice the present invention so as to use the computationally least-expensive interpolation methods that are available.

As the present invention is frequently practiced, one of the dimensions of an interpolation table is the over-the-ground distance (a.k.a. "ground range") to the current target, and another dimension of the interpolation table is the spatial dimension whose derivative with respect to ground range is to be represented. Other factors, such as current speed along some direction, or any other external factor, may also be dimensions of the interpolation table.

The present invention's "spatial-derivative-dependency" interpolation table will usually have at least two spatial dimensions, but it may have an arbitrary number of other parameters. The speed along some direction (usually the ground range direction) is also given by an interpolation table, viz., a "speed-dependency" interpolation table, according to exemplary inventive practice.

According to many inventive embodiments, the "speed-dependency interpolation table" includes all of the dimensions used for the spatial-derivative-dependency interpolation table. However, according to some inventive embodiments, the speed-dependency interpolation table does not include all of the dimensions used for the spatial-derivative-dependency interpolation table.

According to some inventive embodiments, the present invention's spatial-derivative method is combined with a known bead-on-a-wire equation approach to specifying speed. However, recommended inventive practice is to use inventive interpolation tables for both the spatial derivative and the speed component.

Exemplary inventive practice provides a new methodology for rendering a computer model of one or more bodies in motion. Although the terms "model" and "simulation" have occasionally been distinguished from each other in technical usage, these terms are used interchangeably herein to broadly refer to representation of a thing or system of things, such as representation of dynamic trajectories of homing missiles.

BRIEF DESCRIPTION OF THE DRAWINGS

The present invention will now be described, by way of example, with reference to the accompanying drawings, wherein:

FIG. 2 is a matrical/tabular representation of portions of an interpolation table describing the speed component along the ground range versus the ground range and altitude.

FIG. 3 is a partial and enlarged version of the matrical/tabular representation shown in FIG. 2.

FIG. 5 is a matrical/tabular representation of portions of an interpolation table describing the spatial derivative of the "wire shape" versus the ground range and altitude.

FIG. 6 is a partial and enlarged version of the matrical/tabular representation shown in FIG. 5.

DESCRIPTION OF EXEMPLARY EMBODIMENTS OF THE INVENTION

Referring now to the figures, in an initial or preliminary stage of exemplary practice of the present invention, two interpolation tables are generated, viz.: (i) speed (ground range component) versus the desired independent variable(s); and, (ii) spatial derivative versus the desired independent variable(s).

Figure 1:
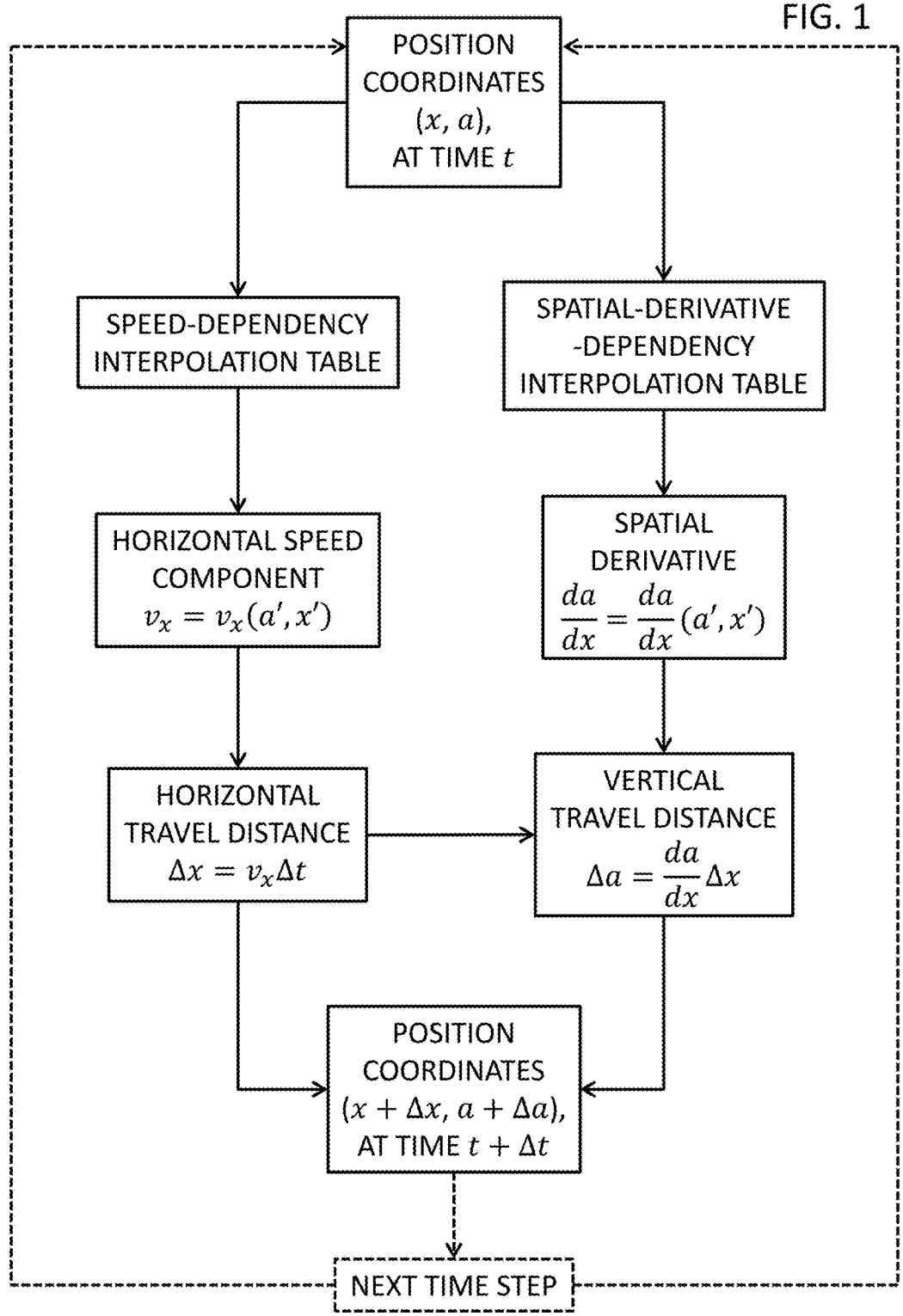
FIG. 1 is a schematic illustrating exemplary practice in accordance with the present invention.
Figure 4:
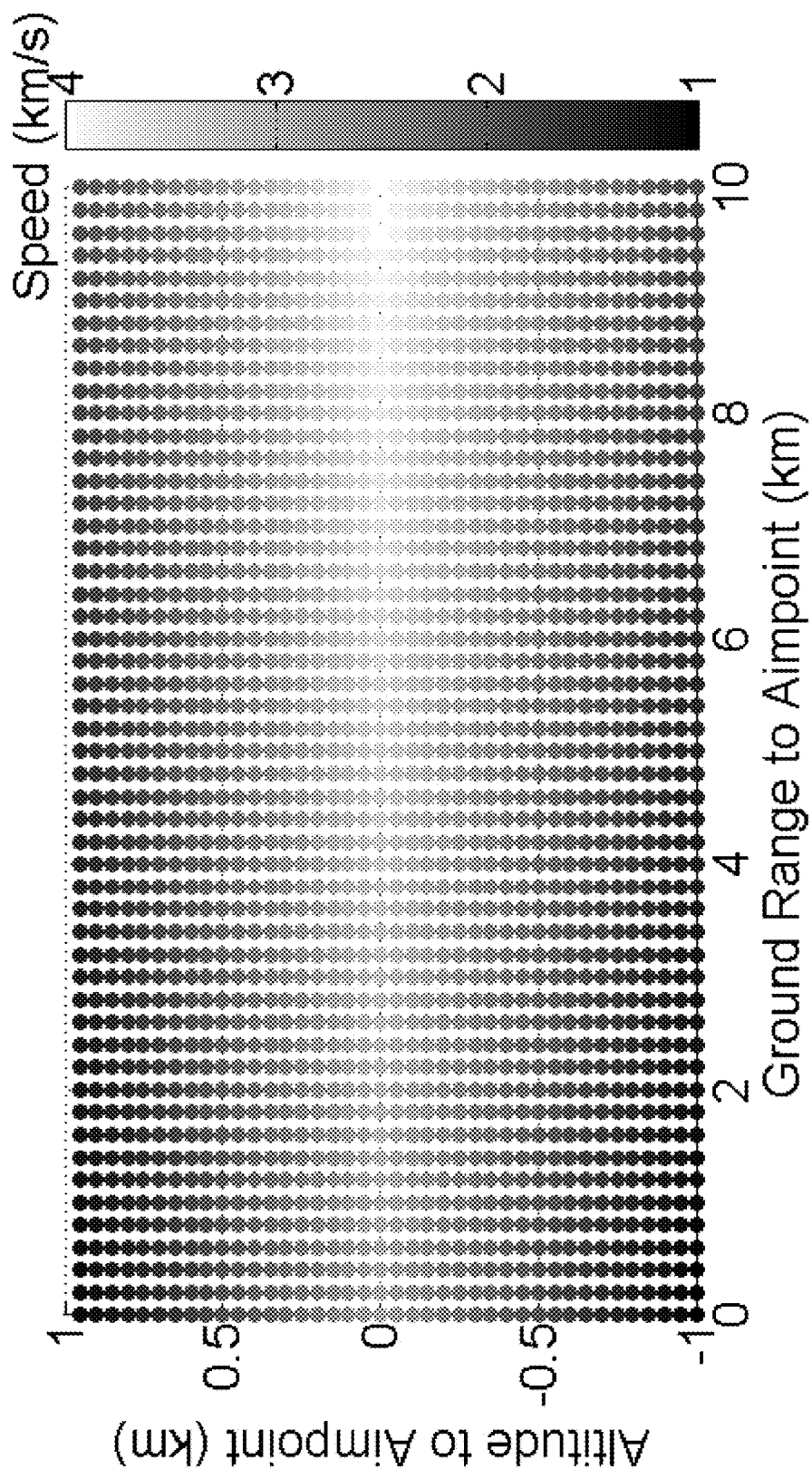
FIG. 4 is a graphical representation of the interpolation table matrically/tabularly represented in FIGS. 2 and 3.
Figure 7:
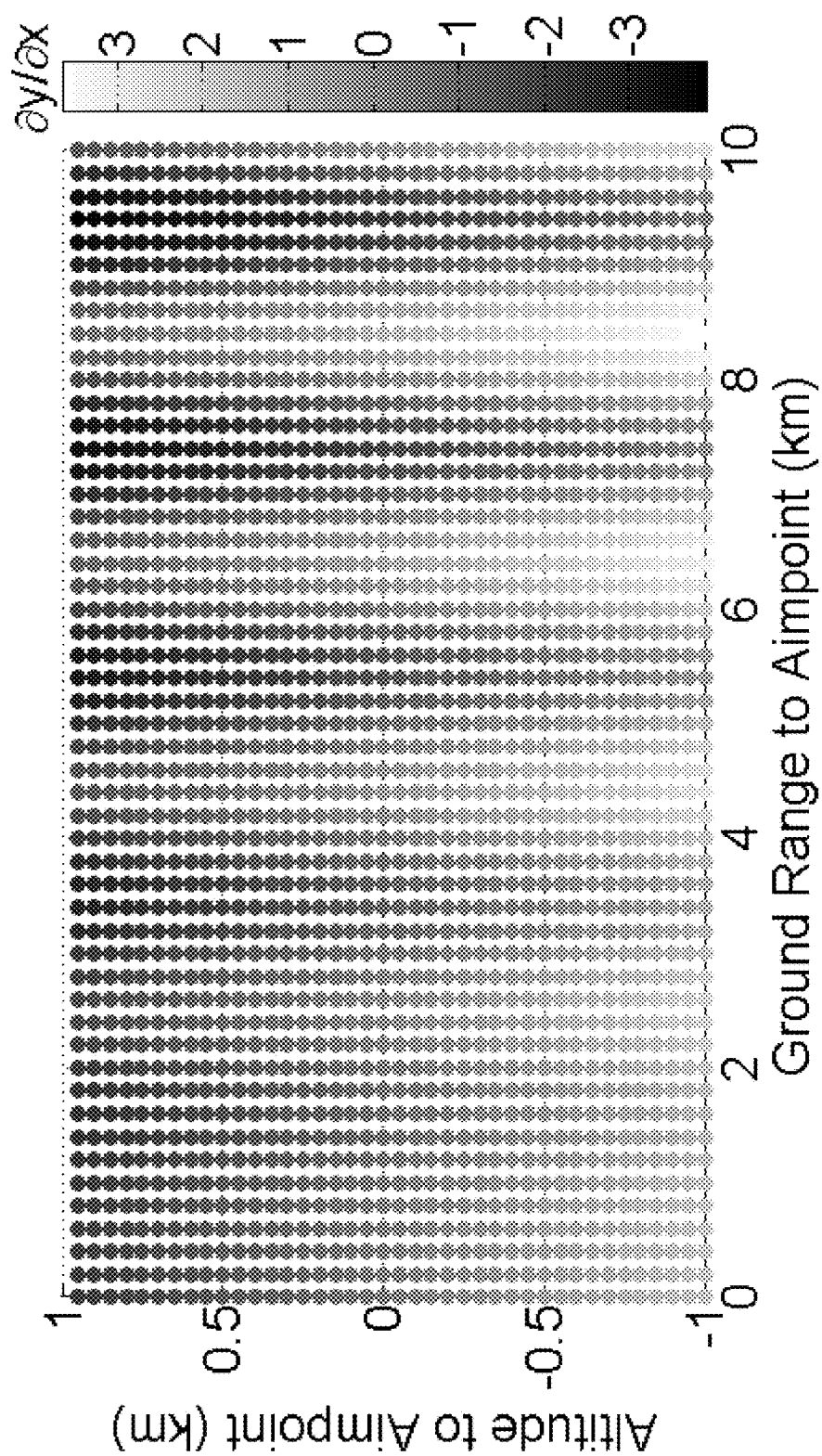
FIG. 7 is a graphical representation of the interpolation table matrically/tabularly represented in FIGS. 5 and 6.

As shown in FIG. 1, these two interpolation tables are referred to herein as, respectively, the (ii) speed-dependency interpolation table, and the (ii) spatial-derivative-dependency interpolation table. Examples of these two types of interpolation tables are depicted in FIGS. 2 through 4 and FIGS. 5 through 7, respectively. FIGS. 4 and 7 exemplify graphical plot representations of interpolation tables for dynamic trajectory generation, in accordance with the present invention.

The present invention is frequently practiced whereby the following two independent variables are implemented, each independent variable corresponding to the projected distance from the vehicle (e.g., guided missile) to the current target along one spatial coordinate: (i) ground range to target; and, (ii) altitude relative to target. The distance components between the vehicle and the target are, by definition, known to the inventive model. Inventive practice also typically assumes that any other parameters on which the interpolation tables depend are known to the inventive model.

It is possible, according to inventive practice, to specify more than two independent variables. By way of example, the inventive methodology can extend to three independent variables. An interpolation table can specify, for instance, the spatial gradient as a function of three independent variables, viz.: (i) ground range to target; (ii) altitude relative to target; and, (iii) the vertical component of missile speed.

An interpolation table can be formulated, for instance, by analyzing trajectories produced by a higher-fidelity model, such as a 6DOF physics model. For regions of the parameter space where there is no data from the high-fidelity model, data values can be constructed in the interpolation table by extrapolation; alternatively, data values can be omitted, the interpolation table thereby constituting a "sparse" matrix. While usual inventive practice is to derive interpolation tables from higher-fidelity models, it is also possible in inventive practice to create notional interpolation tables ad hoc. In the light of the instant disclosure, the ordinarily skilled artisan will appreciate various ways of constructing the speed-dependency interpolation table and the spatial-derivative-dependency interpolation table.

According to the inventive model described herein by way of example, the positions of the missile and target are computed and/or recorded by the inventive model at every time step. The independent variables are model parameters that are, or can be, computed at each time step. For inventive embodiments in which (i) ground range to target and (ii) altitude relative to target are the two independent variables, each of these independent variables is a parameter of the inventive model that is computable (e.g., calculable or estimable) at each time step.

The parameters for an interpolation table are independent variables; the values of the interpolation table (e.g., speed component) are dependent on these independent variables (e.g., relative range and altitude). According to exemplary inventive practice, each interpolation table describes dependency upon the same two independent variables, viz., (i) the horizontal distance between the moving body and the target, and (ii) the vertical distance between the moving body and the target. In the speed-dependency interpolation table, the speed of the moving body depends upon the two independent variables. In the spatial-derivative-dependency interpolation table, the spatial derivative of the trajectory of the moving body depends upon the same two independent variables.

For inventive embodiments having one or more additional independent variables (e.g., speed components), each of these independent variables, as well, is a parameter of the inventive model that is computable (e.g., calculable or estimable) at each time step. Furthermore, according to usual inventive practice, the time step size of the inventive model also is known.

Taking a relatively uncomplicated example of inventive practice, let us assume that motion of a missile is restricted to a vertical geometric plane. Implementation of the inventive model begins at a selected time along the trajectory of the missile. The inventive modeling of moving body trajectory presupposes that every parameter lies in the parameter space covered by the interpolation tables. For instance, the horizontal (ground range) and vertical (altitude) distances between the missile and the target are encompassed by the interpolation tables.

At time t, the missile is at absolute horizontal position x, and is at absolute altitude a. That is, the missile's coordinates at time t are (x, a). The ordinarily skilled artisan who reads the instant disclosure will appreciate that various mathematical symbols and designations can be utilized in practicing the present invention.

The inventive practitioner obtains the horizontal speed component from the speed-dependency interpolation table as follows. The horizontal (ground range) to target is computed or retrieved; this relative distance can be denoted x'. The vertical (relative altitude) to the target is computed or retrieved; this relative distance can be denoted a'. Then the horizontal speed component, which can be denoted $v_x$, is interpolated from the table according to the following equation: $v_x = v_x(a', x')$. In the light of the instant disclosure, the ordinarily skilled artisan will appreciate that there are many possible interpolation schemes to compute (e.g., calculate or estimate) $v_x$, if the values of a' and x' do not correspond exactly to the index values for the interpolation table.

The horizontal speed component is along the projection of ground range between the vehicle and the target. In this example, the horizontal speed component is retrieved from the speed-dependency interpolation table using the known distances and any other known parameters on which the interpolation table depends. As an alternative to obtaining the horizontal speed component from the speed-dependency interpolation table, according to some inventive embodiments the horizontal speed component is obtained from an equation, for instance as a function of time. According to the nomenclature in this example, the horizontal speed component is designated x'. Another designation for the horizontal speed component can be used in inventive practice, such as dx/dt.

The inventive practitioner computes the horizontal travel distance (i.e., the travel along the ground range dimension) that is covered during the current time step. The horizontal travel distance can be denoted $\Delta x$. This computation is performed by multiplying the horizontal speed component (obtained from the speed-dependency interpolation table) by the length of the time step according to the following equation: $\Delta x = v_x \Delta t$. Otherwise expressed, this computation uses the relationship: distance=speed×time. Thus, the distance component traveled along the ground range direction is computed by multiplying the obtained speed value by the elapsed time. This computation assumes that the time steps of the inventive model are appropriately sized so as to make straight-line approximations between time steps reasonable.

The inventive practitioner obtains the spatial derivative of the trajectory shape (in "bead-on-a-wire" terms, "wire shape") from the spatial-derivative-dependency interpolation table. The same values of absolute horizontal position x and absolute altitude a are used to obtain the spatial derivative, as are used to obtain the horizontal speed component. The spatial derivative, which can be denoted da/dx, is interpolated from the table according to the following equation:

$$\frac{da}{dx} = \frac{da}{dx}(a', x').$$

An alternative denotation for the spatial derivative, such as dy/dx, may be used in inventive practice. It is assumed in this example that the maneuvering of the moving body is restricted to the x-y plane, which is a vertical geometric plane. The spatial derivative is obtained from the spatial-derivative-dependency interpolation table, using the known distances and/or any other known parameters on which the spatial-derivative-dependency interpolation table depends.

The inventive practitioner computes the vertical travel distance (i.e., the travel along the altitude dimension) that is covered during the current time step. The vertical travel distance can be denoted $\Delta a$. The horizontal travel distance $\Delta x$ (the travel along the horizontal dimension) during the current time step is already computed. Therefore, the following equation is used to obtain the vertical travel distance $\Delta a$:

$$\Delta a = \frac{da}{dx}\Delta x.$$

That is, computation of the vertical travel distance $\Delta a$ is performed by multiplying the horizontal travel distance $\Delta x$ by the spatial derivative $da/dx$. An alternative denotation for the vertical travel distance, such as $\Delta y$, may be used in inventive practice.

In this example of inventive practice, the determination of the horizontal travel distance $\Delta x$ precedes the determination of the vertical travel distance $\Delta a$, and the vertical travel distance $\Delta a$ is obtained using the determined horizontal travel distance $\Delta x$ in the equation $$\Delta a = \frac{da}{dx}\Delta x.$$

Distance $\Delta a$, which is the distance component traveled along the y direction, is computed by multiplying the spatial derivative value by the distance traveled along the ground range direction. The ordinarily skilled artisan who reads the instant disclosure will understand that, alternatively, the present invention can be practiced whereby the determination of the vertical travel distance $\Delta a$ precedes the determination of the horizontal travel distance $\Delta x$, and the vertical travel distance $\Delta a$ is used in order to obtain the horizontal travel distance $\Delta x$.

The inventive model of moving body trajectory commences at a selected starting time t along the trajectory of the missile. At time t, the missile is at horizontal position x and is at altitude a. That is, at initial time t, the missile is at horizontal position x, and is at altitude a. The missile's geometric coordinates at time t are (x, a). Implementation of the inventive algorithm yields position coordinates of the missile at a later point in time, viz., at time t+$\Delta$t. The new position coordinates of the missile at time (t+$\Delta$t) are given by (a+$\Delta$a) and (x+$\Delta$x). That is, at incremental time t+$\Delta$t, the missile is at horizontal position x+$\Delta$x, and is at altitude a+$\Delta$a. The missile's geometric coordinates at time t+$\Delta$t are (a+$\Delta$a, x+$\Delta$x).

The present invention is typically practiced in an iterative manner, using the same interpolation tables. To continue implementing the inventive method, the relative horizontal range x' and the relative altitude a' are recalculated, using the new positions of the missile and the target. Each iteration describes a time step that includes determination of the following: the original missile-position coordinates; the horizontal speed component; the horizontal travel distance; the spatial derivative; the vertical travel distance; and, the incremental missile-position coordinates. The iterative time steps can be repeated as many times as needed or desired, for instance until the missile intersects the target. In each successive time step, the incremental missile-position coordinates become the starting missile-position coordinates, and incremental coordinates are determined anew. The inventive process works dynamically because the interpolation tables are parameterized by the distances to the current target. Thus, if the target location changes, as long as the distance to the new target location is within the envelope of the interpolation table, the next increments of motion may be computed without any coordinate transformations.

Figure 2:
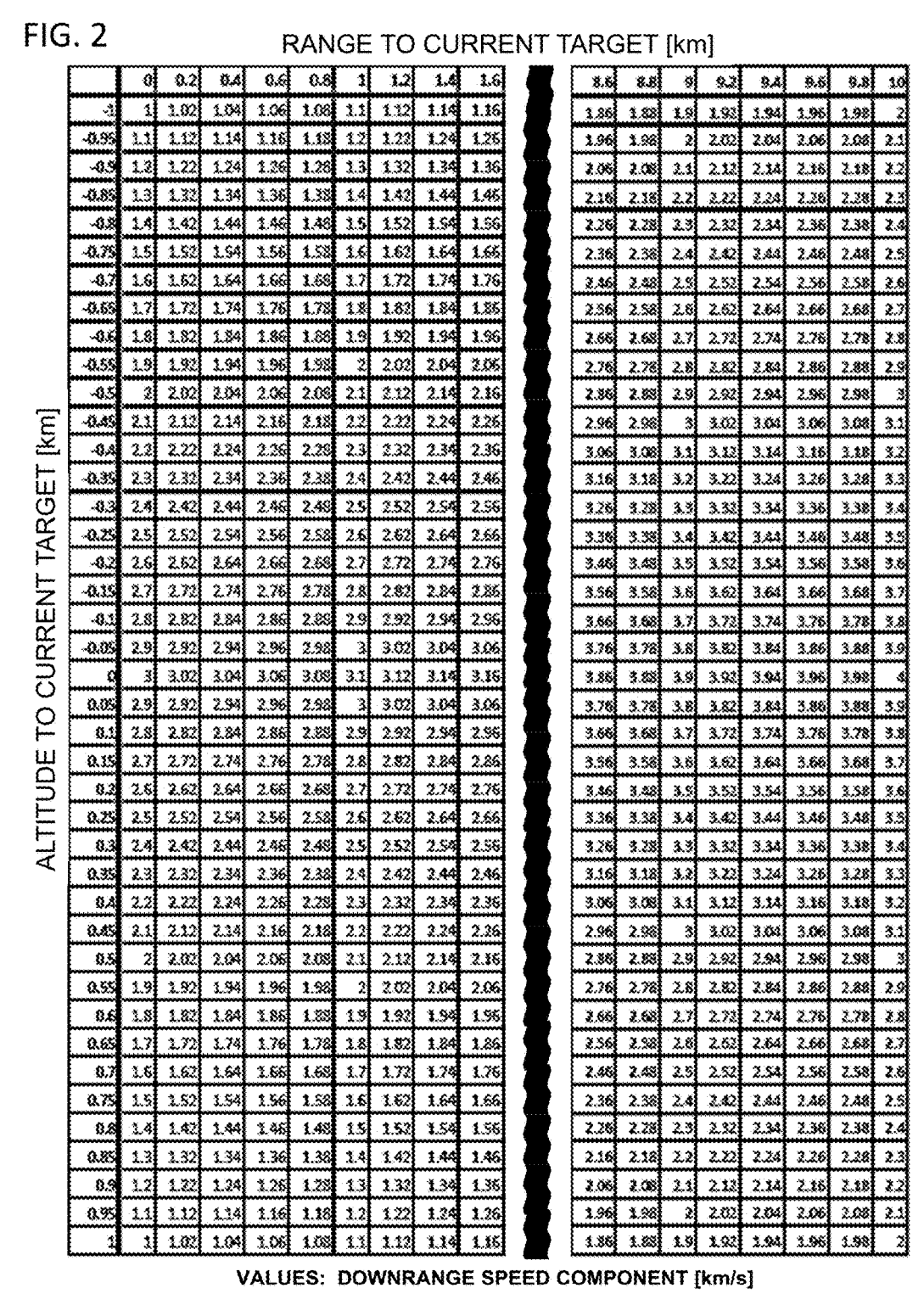

FIGS. 2 through 4 and FIGS. 5 through 7, respectively, contain examples of the present invention's two interpolation tables for the case of a notional air-to-air missile that performs a dynamic weave within a two-dimensional plane while attacking a stationary target. This case can be extended to three dimensions by a person (e.g., an analyst) skilled in the art who reads the instant disclosure. FIGS. 2-4 show the speed component along the ground-range direction as a function of both the current ground range and current altitude of the missile relative to its target. FIGS. 5-7 shows the local spatial derivative of the trajectory as a function of current ground range and current altitude.

FIGS. 4 and 7 are grayscale renditions of color graphs. The ordinarily skilled artisan who reads the instant disclosure will appreciate that graphical interpolation tables such as shown in FIGS. 4 and 7 will tend to be more comprehensible using contrasting colors. For instance, color gradations indicate a scale or spectrum of values (e.g., spanning the visible light spectrum) for the speed component in FIG. 4; similarly, color gradations indicate a scale or spectrum of values (e.g., spanning the visible light spectrum) for the spatial derivative in FIG. 7.

Figure 8:
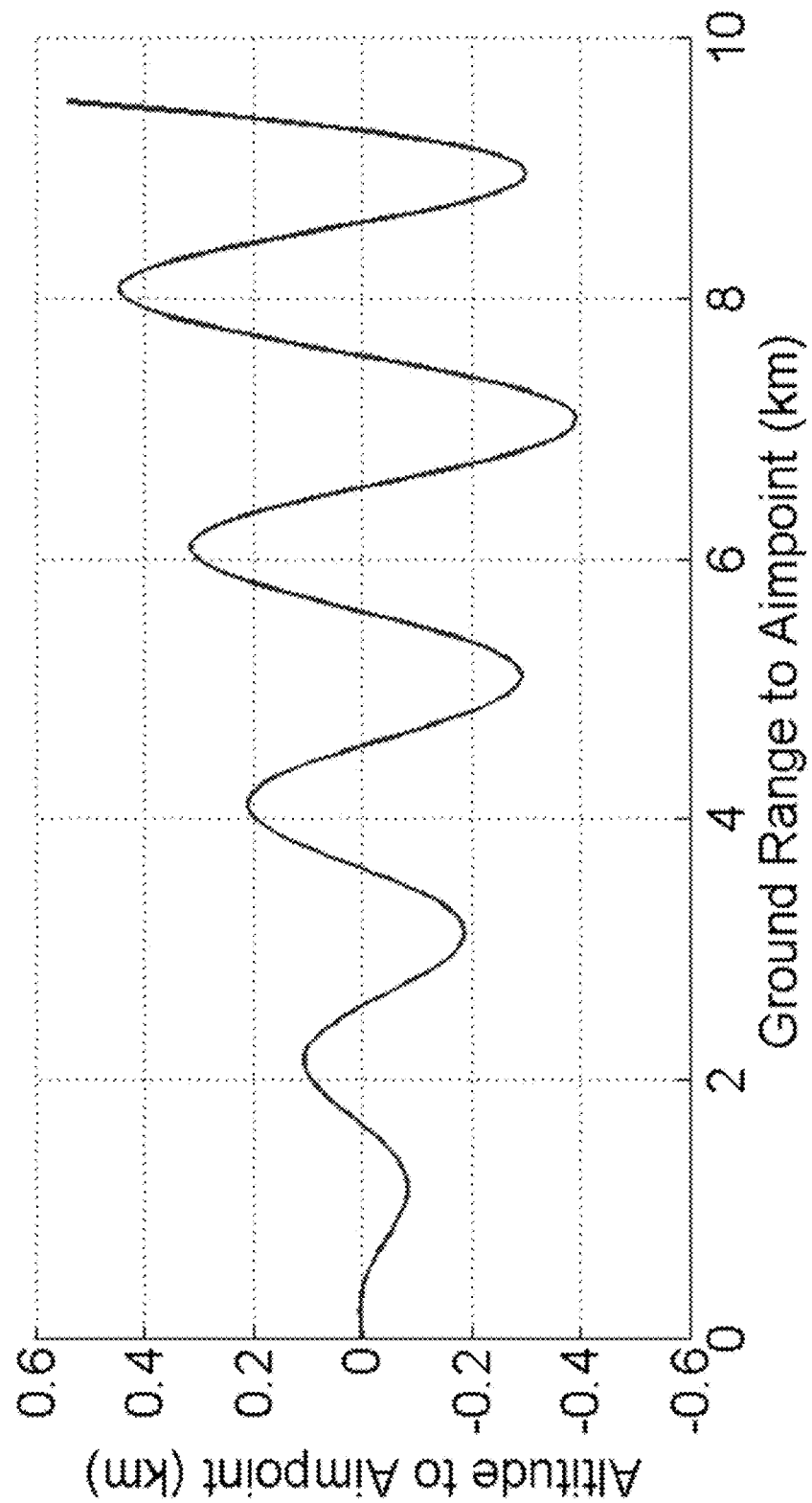
FIG. 8 is an example, in accordance with the present invention, of a graphical representation of trajectory, generated from the two interpolation tables respectively depicted in FIGS. 2-4 and FIGS. 5-7.

In accordance with exemplary practice of the present invention, based on the interpolation tables shown in FIGS. 2-4 and 5-7, an appropriate trajectory can be iteratively developed given the initial distance to the target in both ground range and altitude using the procedure outlined above. An example of one such trajectory for a stationary target is shown in FIG. 8.

Figure 9:
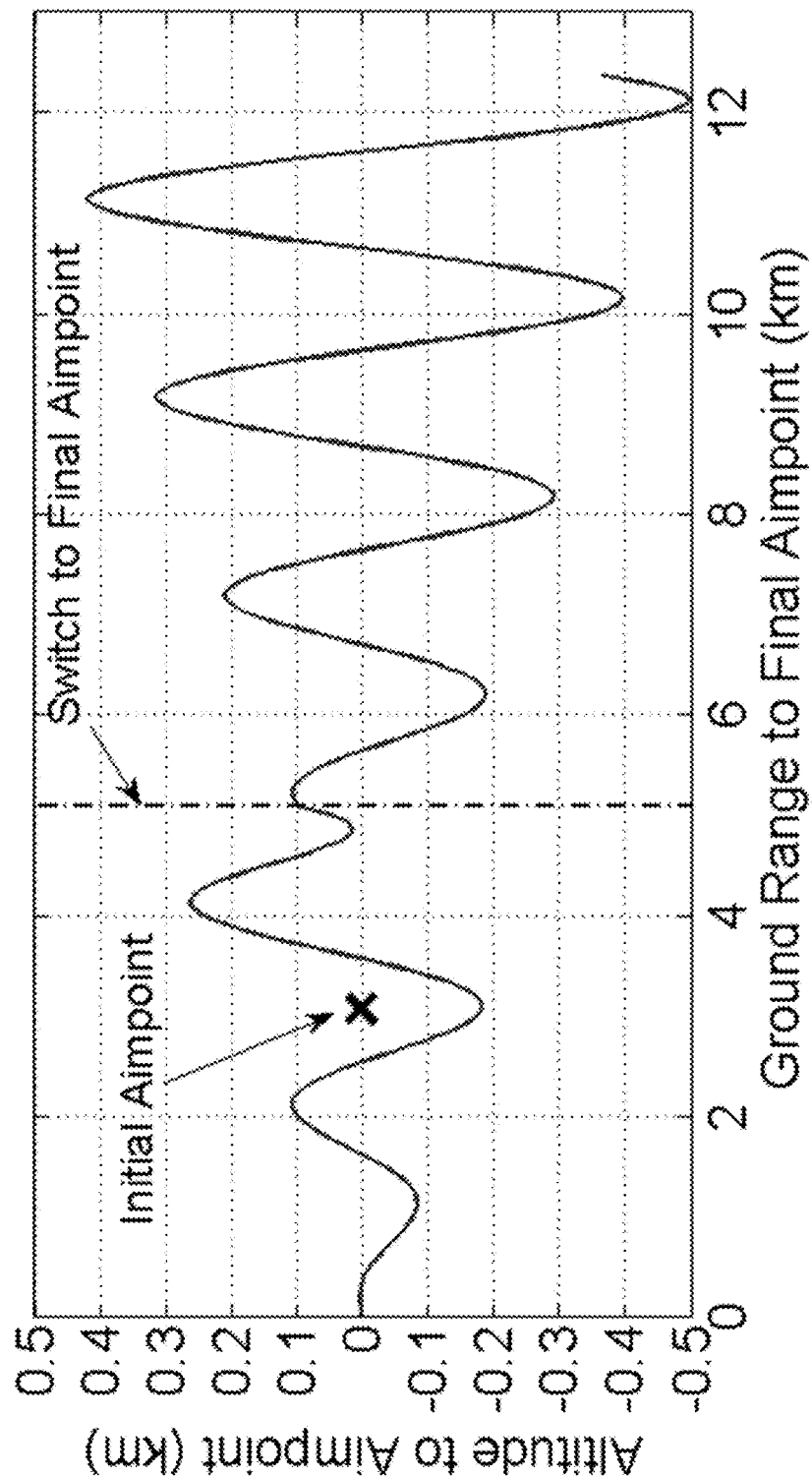
FIG. 9 is an example, in accordance with the present invention, of a graphical representation of trajectory with aimpoint change, generated from the two interpolation tables respectively depicted in FIGS. 2-4 and FIGS. 5-7.

FIG. 9 illustrates the benefits of the inventive method in a contrived case where the target changes once during the missile's flight. This example can be extended to a continuously changing aimpoint by a person (e.g., an analyst) skilled in the art who reads the instant disclosure. At a certain point (indicated in FIG. 9 by the vertical dashed line at ground range slightly above 5 kilometers), the initial aimpoint (marked by x) is switched to an aimpoint further downrange (at the origin in FIG. 9).

The inventive model automatically identifies the appropriate part of the interpolation table, and smoothly changes the trajectory in a reasonable way, with no coordinate transformations. In the contrived case shown in FIG. 9, the switching point has been chosen to suppress discontinuities in the flight path arising from the relative crudeness of the two-dimensional interpolation table. For more general cases, more dimensions may be required in the interpolation tables to avoid artifacts representing unphysical accelerations. Nevertheless, even with an expanded interpolation table, the method of the present invention will require less computational expense than will a conventional method such as a 6-DOF method.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A computer-implemented method for describing motion of a moving object, the method comprising:
   determining a horizontal distance traveled by said guided self-propelled moving object from an initial position of said guided self-propelled moving object, said determining of the horizontal distance traveled including taking into consideration a speed of said guided self-propelled moving object, a horizontal distance between said guided self-propelled moving object and a moving target, and a vertical distance between said guided self-propelled moving object and said moving target, wherein the speed of said guided self-propelled moving object is determined using a speed-dependency interpolation table, said speed-dependency interpolation table describing the speed of said guided self-propelled moving object along a ground range to said moving target versus the ground range to said moving target and an altitude relative to said moving target;
   determining a vertical distance traveled by said guided self-propelled moving object from the initial position, said determining of the vertical distance traveled including taking into consideration the horizontal distance traveled and a spatial derivative of a trajectory of said guided self-propelled moving object, wherein the spatial derivative of the trajectory of said guided self-propelled moving object is determined using a spatial-derivative-dependency interpolation table, said spatial-derivative-dependency interpolation table describing the spatial derivative of the trajectory of said guided self-propelled moving object versus the ground range to said moving target and the altitude relative to said moving target;
   determining a final position of said guided self-propelled moving object;
   incrementally modeling the dynamic trajectory of a guided self-propelled moving object, wherein:
   said incrementally modeling the dynamic trajectory of said guided self-propelled moving object is performed using a computer, is based on temporal and spatial relationships between said guided self-propelled moving object and said moving target, and includes dynamically determining a changing shape of a wire with reference to a moving aimpoint in a bead-on-a-wire construct characterizing the dynamic trajectory of said guided self-propelled moving object;
   the bead-on-a-wire construct describes a wire and a speed of a moving bead moving along the wire as a function of time;
   the moving bead represents said guided self-propelled moving objects;
   the moving aimpoint represents said moving target;
   the shape of the wire represents an overall shape of the dynamic trajectory of said guided self-propelled moving object;
   said dynamically determining the changing shape of the wire includes using a spatial gradient of the shape of the wire.

2. The method of claim 1, wherein:
   the horizontal distance traveled is the horizontal distance traveled by said moving object during a time step;
   the vertical distance traveled is the vertical distance traveled by said moving object during said time step;
   said initial position is at the beginning of said time step;
   said final position is at the end of said time step.

3. The method of claim 2, wherein:
   said method further comprises performing at least one iteration of said establishing of the initial position, said determining of the horizontal distance traveled, said determining of the vertical distance traveled, and said determining of the final position;
   in each said iteration, the initial position is the final position of the previous said iteration;
   in each said iteration, the beginning of said time step is the end of said time step of the previous said iteration.

4. The method of claim 3, wherein each said time step has the same duration.

5. The method of claim 1 comprising:
   providing said speed-dependency interpolation table;
   providing said spatial-derivative-dependency interpolation table;
   establishing said initial position of said guided self-propelled moving object.

6. An apparatus comprising a computer having computer code characterized by computer program logic for enabling said computer to describe motion of a guided and self-propelled moving object, said computer code being executable by said computer so that, in accordance with said computer program logic, said computer performs acts including:
   determining a horizontal distance traveled by said moving object from an initial position of said moving object, said determination of the horizontal distance traveled being based on a speed of said moving object, a horizontal distance between said object and a moving target, and a vertical distance between said moving object and said moving target, wherein the speed of said moving object is determined using a speed-dependency interpolation table, said speed-dependency interpolation table describing the speed of said moving object along a ground range to said moving target versus the ground range to said moving target and an altitude relative to said moving target;
   determining a vertical distance traveled by said moving object from the initial position of said moving object, said determination of the vertical distance traveled being based on the horizontal distance traveled by said moving object and a spatial derivative of a trajectory of said moving object, wherein the spatial derivative of the trajectory of said moving object is determined using a spatial-derivative-dependency interpolation table, said spatial-derivative-dependency interpolation table describing the spatial derivative of the trajectory of said moving object versus the ground range to said moving target and the altitude relative to said moving target;
   determining a final position of said moving object;
   incrementally modeling the dynamic trajectory of said moving object, wherein said incrementally modeling the dynamic trajectory of said moving object is based on temporal and spatial relationships between said moving object and said moving target, wherein said incrementally modeling the dynamic trajectory of said moving object includes dynamically determining a changing shape of a wire with reference to a moving aimpoint in a bead-on-a-wire construct characterizing the dynamic trajectory of said moving object, the bead-on-a-wire construct describing a wire and a speed of a moving bead moving along the wire as a function of time, the moving bead representing said moving object, the moving aimpoint representing said moving target, the shape of the wire representing an overall shape of the dynamic trajectory of said moving object, wherein said dynamically determining the changing shape of the wire includes using a spatial gradient of the shape of the wire.

7. The apparatus of claim 6, wherein:
the horizontal distance traveled is the horizontal distance traveled by said moving object during a time step;
the vertical distance traveled is the vertical distance traveled by said moving object during said time step;
said initial position is at the beginning of said time step;
said final position is at the end of said time step.

8. The apparatus of claim 7, wherein:
said computer performs acts further including performing at least one iteration of said establishment of the initial position, said determination of the horizontal distance traveled, said determination of the vertical distance traveled, and said determination of the final position;
in each said iteration, the initial position is the final position of the previous said iteration;
in each said iteration, the beginning of said time step is the end of said time step of the previous said iteration.

9. The apparatus of claim 7, wherein said computer performs acts including:
providing said speed-dependency interpolation table;
providing said spatial-derivative-dependency interpolation table;
establishing said initial position of said moving object.

10. The apparatus of claim 8, wherein each said time step has the same duration.

11. A computer program product for modeling the dynamic trajectory of a moving body, the computer program product comprising a non-transitory computer-readable storage medium having computer-readable program code portions stored therein for execution by a computer, the computer-readable program code portions including:
a first executable program code portion, for providing a speed-dependency interpolation table;
a second executable program code portion, for providing a spatial-derivative-dependency interpolation table;
a third executable program code portion, for establishing a time step, a first horizontal position coordinate, and a first vertical position coordinate, wherein the first horizontal position coordinate and the first vertical position coordinate define a position of a moving body at the beginning of the time step, said moving body being a guided and self-propelled moving body;
a fourth executable program code portion, for computing a speed-dependency relationship, the speed-dependency relationship describing a relationship between a speed of said moving body and at least two independent variables, wherein said at least two independent variables include a horizontal distance between said moving body and a moving target, and a vertical distance between said moving body and said moving target, wherein the speed of said moving body is determined using said speed-dependency interpolation table, said speed-dependency interpolation table describing the speed of said moving body along a ground range to said moving target versus a ground range to said moving target and an altitude relative to said moving target;
a fifth executable program code portion, for providing a spatial-derivative-dependency relationship, wherein the spatial-derivative-dependency relationship describes a relationship between a spatial derivative of a trajectory of said moving body and said at least two independent variables, wherein the spatial derivative of the trajectory of said moving body is determined using said spatial-derivative-dependency interpolation table, said spatial-derivative-dependency interpolation table describing the spatial derivative of the trajectory of said moving object versus the ground range to said moving target and the altitude relative to said moving target;
a sixth executable program code portion, for computing a horizontal speed component of said moving body, wherein the computation of the horizontal speed component includes using the speed-dependency relationship;
a seventh executable program code portion, for computing a horizontal travel distance of said moving body, wherein the computation of the horizontal travel distance includes using the horizontal speed component;
an eighth executable program code portion, for computing a spatial derivative of said moving body, wherein the computation of the spatial derivative includes using the spatial-derivative-dependency relationship;
a ninth executable program code portion, for computing a vertical travel distance of said moving body, wherein the computation of the vertical travel distance includes using the horizontal travel distance and the spatial derivative;
a tenth executable program code portion, for computing a second horizontal position coordinate and a second vertical position coordinate, the second horizontal position coordinate and the second vertical position coordinate defining a position of said moving body at the end of the time step, wherein the computation of the second horizontal position coordinate and the second vertical position coordinate includes using the computed horizontal travel distance and the computed vertical travel distance;
an eleventh executable program code portion, for incrementally modeling the dynamic trajectory of said moving body, wherein said incrementally modeling the dynamic trajectory of said moving body is based on temporal and spatial relationships between said moving body and said moving target, wherein said incrementally modeling the dynamic trajectory of said moving body includes computing a dynamically changing shape of a wire with reference to a moving aimpoint in a bead-on-a-wire construct characterizing the dynamic trajectory of said moving body, the bead-on-a-wire construct describing a wire and a speed of a moving bead moving along the wire as a function of time, the moving bead representing said moving body, the moving aimpoint representing said moving target, the shape of the wire representing an overall shape of the dynamic trajectory of said moving body, wherein said computing the changing shape of the wire includes using a spatial gradient of the shape of the wire.

12. The computer program product of claim 11, wherein:
the duration of the time step is $\Delta t$;
the beginning time of the time step is t;
the ending time of the time step is $t+\Delta t$;
the first horizontal position coordinate is x;
the first vertical position coordinate is a;
the second horizontal position coordinate is $x+\Delta x$;
the second vertical position coordinate is $a+\Delta a$;
the horizontal speed component is $v_x$;
the spatial derivative is da/dx;

the horizontal travel distance is $\Delta x$;

the vertical travel distance is $\Delta a$;

the computation of the horizontal travel distance is in accordance with the equation $\Delta x = v_x \Delta t$;

the computation of the vertical travel distance is in accordance with the equation $$\Delta a = \frac{da}{dx} \Delta x.$$

13. The computer program product of claim 12, wherein:

the computer-readable program code portions further include a twelfth executable program code portion, for bringing about at least one iteration of the computations of the computer-readable program code portions including said sixth executable program code portion, said seventh executable program code portion, said eighth executable program code portion, said ninth executable program code portion, and said tenth executable program code portion;

in each said iteration: said first horizontal position coordinate is said second horizontal position coordinate of the previous said time step; said first vertical position coordinate is said second vertical position coordinate of the previous said time step; the beginning time of said time step is the ending time of the previous said time step.

14. The computer program product of claim 13, wherein each said time step has the same duration $\Delta t$.

15. The computer program product of claim 11, wherein:

the computer-readable program code portions further include a twelfth executable program code portion, for bringing about at least one iteration of the computations of the computer-readable program code portions including said sixth executable program code portion, said seventh executable program code portion, said eighth executable program code portion, said ninth executable program code portion, and said tenth executable program code portion;

in each said iteration: said first horizontal position coordinate is said second horizontal position coordinate of the previous said time step; said first vertical position coordinate is said second vertical position coordinate of the previous said time step; the beginning time of said time step is the ending time of the previous said time step.

16. The computer program product of claim 15, wherein each said time step has the same duration.

17. The method of claim 1, wherein said incrementally modeling the dynamic trajectory of said guided self-propelled moving object includes using a computer display for representing the dynamic trajectory of said guided self-propelled moving object.

18. The apparatus of claim 6, wherein said incrementally modeling the dynamic trajectory of said moving object includes using a computer display for representing the dynamic trajectory of said moving object.

19. The computer program product of claim 11, wherein said incrementally modeling the dynamic trajectory of said moving body includes using a computer display for representing the dynamic trajectory of said moving body.

\* \* \* \* \*